United States Patent [19]
Koike et al.

[11] Patent Number: 5,578,518
[45] Date of Patent: Nov. 26, 1996

[54] METHOD OF MANUFACTURING A TRENCH ISOLATION HAVING ROUND CORNERS

[75] Inventors: Hidetoshi Koike, Kawasaki; Kazunari Ishimaru; Hiroshi Gojohbori, both of Yokohama; Fumitomo Matsuoka, Kawasaki, all of Japan

[73] Assignee: Kabushiki Kaisha Toshiba, Tokyo, Japan

[21] Appl. No.: 356,526

[22] Filed: Dec. 15, 1994

[30] Foreign Application Priority Data

Dec. 20, 1993 [JP] Japan .................................. 5-320576

[51] Int. Cl.⁶ .................................................. H01L 21/76
[52] U.S. Cl. ........................... 437/67; 437/62; 437/63; 437/64; 437/981; 148/DIG. 50; 148/DIG. 161
[58] Field of Search ........................... 437/67, 62, 63, 437/981; 148/DIG. 50, DIG. 161

[56] References Cited

U.S. PATENT DOCUMENTS

| | | | |
|---|---|---|---|
| 4,563,227 | 1/1986 | Sakai et al. | 437/67 |
| 4,663,832 | 5/1987 | Jambotkar | 437/67 |
| 4,871,685 | 10/1989 | Taka et al. | 437/69 |
| 4,916,086 | 4/1990 | Takahashi et al. | 437/67 |
| 4,931,409 | 6/1990 | Nakajima et al. | 437/67 |
| 5,084,408 | 1/1992 | Baba et al. | 437/73 |
| 5,258,332 | 11/1993 | Horioka et al. | 437/67 |
| 5,332,683 | 7/1994 | Miyashita et al. | 437/67 |

FOREIGN PATENT DOCUMENTS

| | | | |
|---|---|---|---|
| 0154144 | 7/1986 | Japan | 437/67 |
| 0287024 | 11/1988 | Japan | 437/67 |
| 0241129 | 9/1989 | Japan | 437/67 |
| 0034541 | 2/1991 | Japan | 437/70 |
| 0030557 | 2/1992 | Japan | 437/67 |

*Primary Examiner*—Trung Dang
*Attorney, Agent, or Firm*—Loeb & Loeb LLP

[57] ABSTRACT

A semiconductor device comprises a semiconductor substrate having a major surface, a trench device isolation region having a trench selectively formed to define at least one island region in the major surface of the semiconductor substrate and a filler insulatively formed within the trench, an elongated gate electrode insulatively formed over a central portion of the island region so that each of its both ends which are opposed to each other in the direction of its length overlaps the trench device isolation region, and source and drain regions formed within the island region on the both sides of the gate electrode. The surface of the trench device isolation region is formed lower than the major surface of the semiconductor substrate. Those portions of the major surface of the semiconductor substrate that are located under the gate electrode at the boundary with the trench device isolation region are rounded, and the radius of curvature of these portions of the major surface of the semiconductor substrate is selected to be not less than 50 nm.

12 Claims, 7 Drawing Sheets

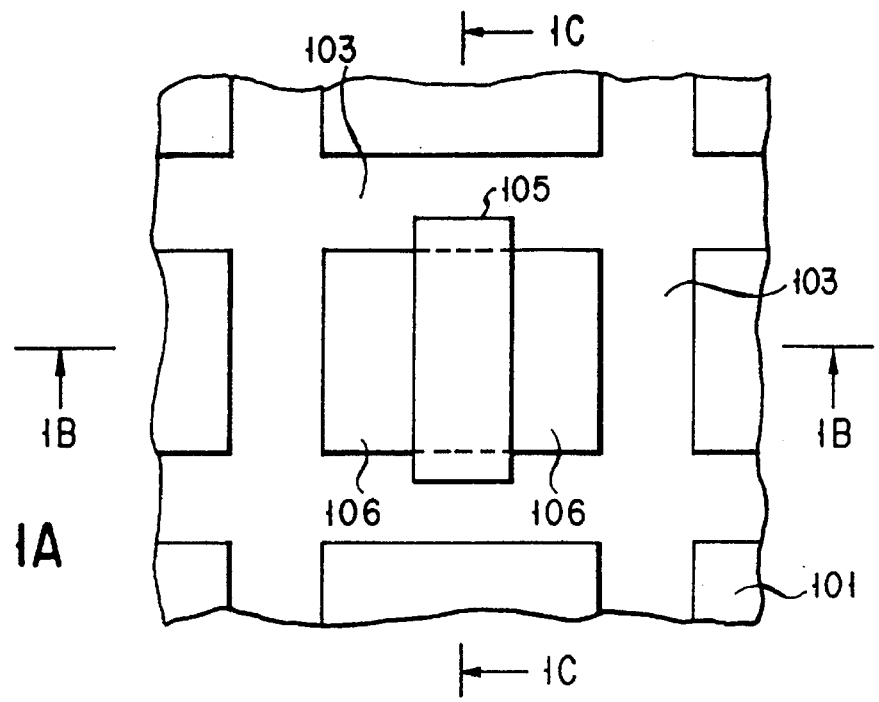
F I G. 1A
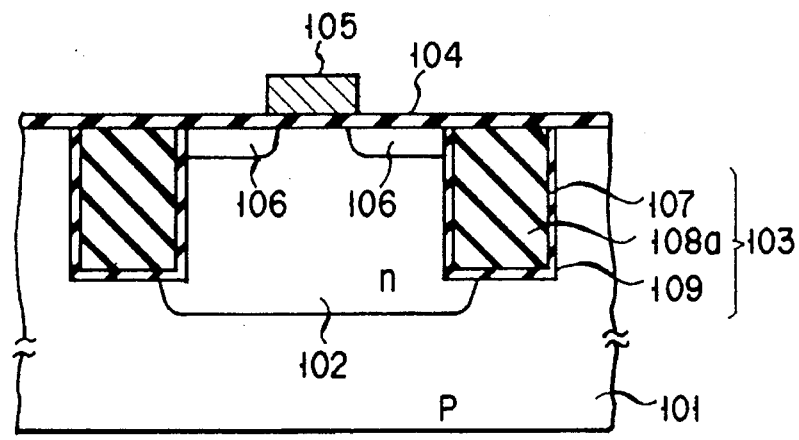
F I G. 1B
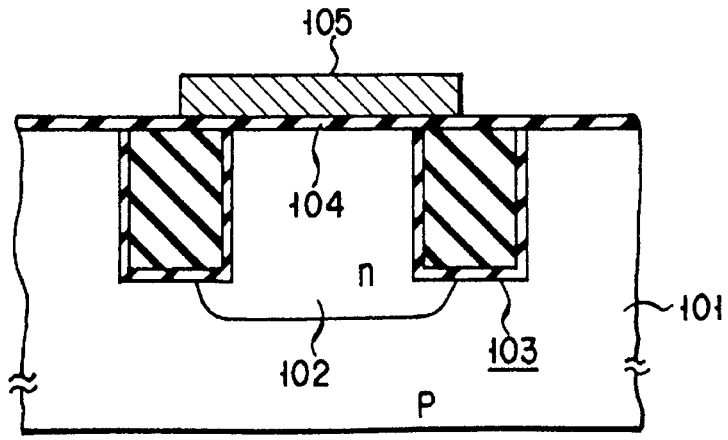
F I G. 1C

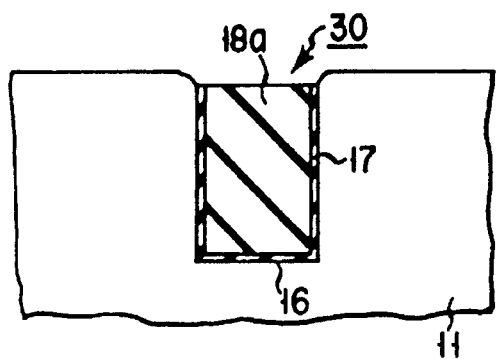
F I G. 4G
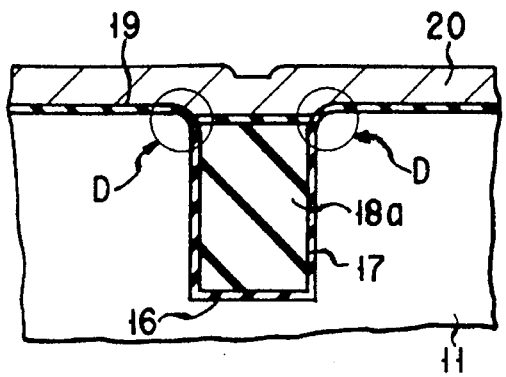
F I G. 4H
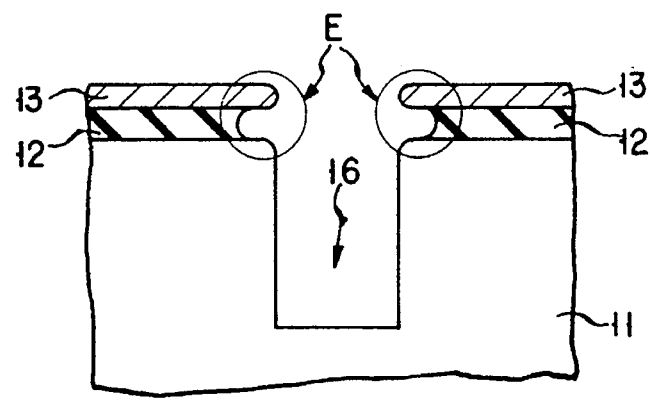
F I G. 5
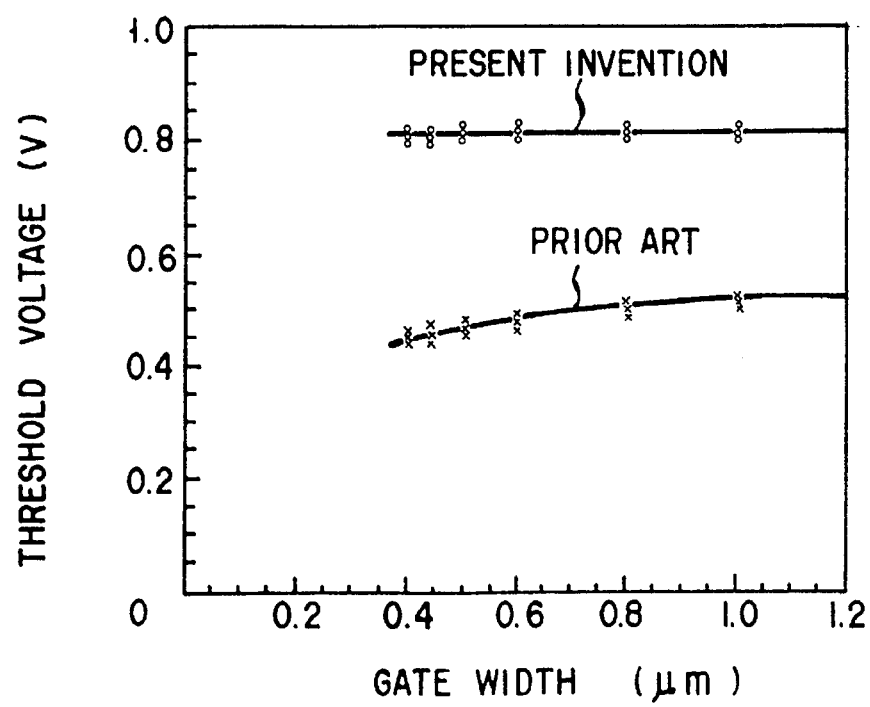
F I G. 8

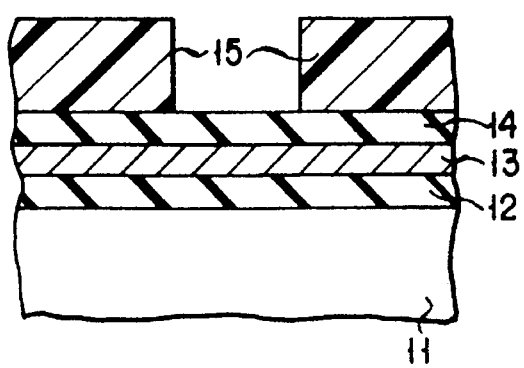
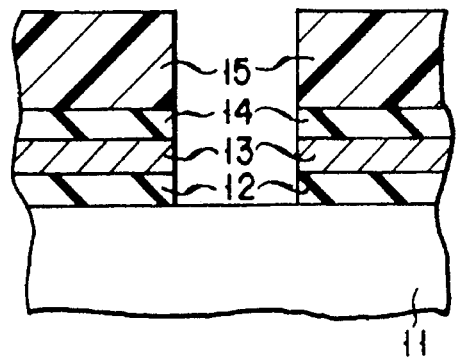
FIG. 6A
FIG. 6B
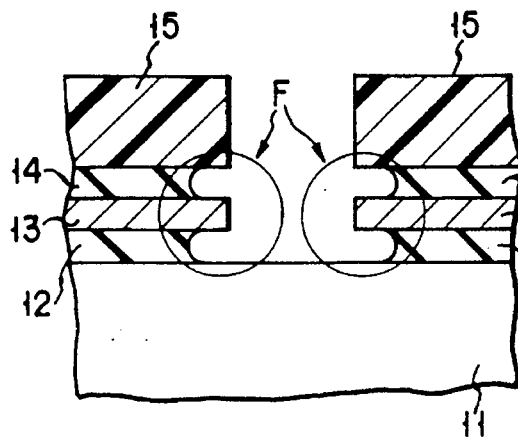
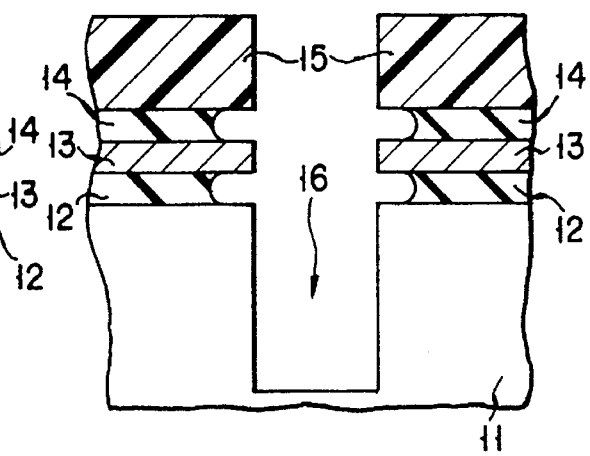
FIG. 6C
FIG. 6D
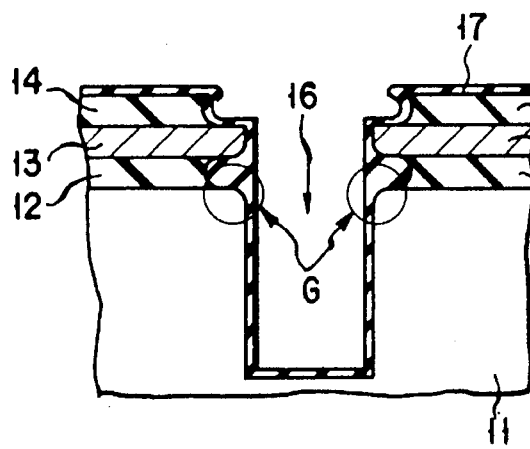
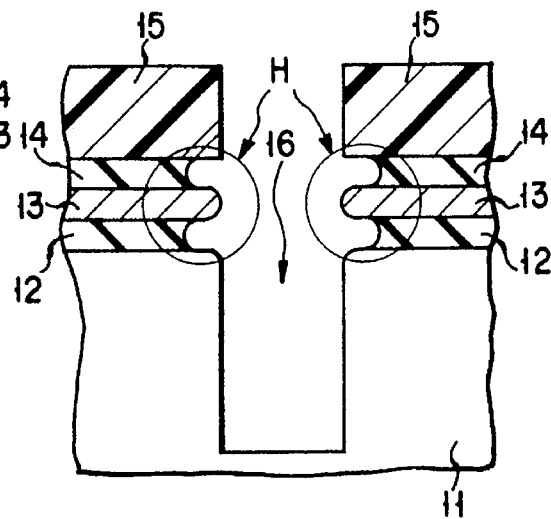
FIG. 6E
FIG. 7

METHOD OF MANUFACTURING A TRENCH ISOLATION HAVING ROUND CORNERS

BACKGROUND OF THE INVENTION

1. Field of the Invention

The present invention relates to a semiconductor device and a method of manufacturing the same. More specifically, the present invention relates to a semiconductor device having a trench-type device isolation region and a manufacturing method of the device isolation region.

2. Description of the Related Art

With the advance of microminiaturization (fine structuring) of integrated circuits, the area allowed for device isolation regions has been increasingly reduced. Thus, these conventional device isolation regions formed by means of LOCOS (Local Oxidation Of Silicon) are becoming difficult to use. To accommodate the recent fine structuring integrated circuits, trench device isolation has been proposed (for instance, see IBM Technical Disclosure Bulletin, Vol. 25, No. 8, Jan. 1983). However, if a MOS transistor is formed in a fine region surrounded with a device isolation region formed by this method, a new problem will arise in the properties of the resultant transistor.

First, the structure of a MOS transistor formed surrounded with a trench isolation region will be described with reference to FIGS. 1A, 1B and 1C. FIG. 1A is a plan view of the MOS transistor formed surrounded with the trench isolation region, and FIGS. 1B and 1C are cross-sectional views taken along the line 1B—1B and the line 1C—1C of FIG. 1A. For example, an n-type well 102 is formed surrounded with a trench isolation region 103 in a p-type silicon substrate 101. The trench isolation region 103 is formed of an insulating layer 107 deposited on the wall of a trench 109 and an insulating layer 108a embedded in the trench. A gate insulating layer 104 is deposited over the entire surface of the substrate 101 and a gate electrode 105 is then formed on a selected portion of the gate insulating layer. The gate electrode is formed so that both of its ends which are opposed to each other in the direction of its length overlap the isolation region 103. On the opposite sides of the gate electrode along its width, substrate regions surrounded with the isolation region 103 and the gate electrode 105 are ion implanted with impurities, such as phosphorus (P), arsenic (As) or the like, forming n-type diffused layers 106 which serve as the source and drain regions of the MOS transistor.

Next, the formation of the trench performed prior to the formation of that transistor and its associated problems will be described with reference to FIGS. 2A, 2B, and 2C. The formation of the well is omitted only for the purpose of simplifying the description. First, a thin layer 112 of silicon oxide of about 100 nm thickness is formed or deposited on the entire surface of the silicon substrate 101 by a conventional thermal oxidation technique. Then, the oxide layer 112 is coated with a photoresist layer and a resist pattern 113 is formed by the use of a lithography technique. Next, the oxide layer 112 is selectively etched with the resist pattern 113 used as a mask. After that, the silicon substrate 101 is etched to a depth of about 500 nm, forming the trench 109 for subsequent use as the device isolation region (FIG. 2A).

Next, after the removal of the resist pattern 113, an oxide layer 107 is thermally grown at a thickness of about 20 nm over the entire surface of the substrate including the trench 109 in order to remove etching induced damage. Then, an oxide layer 108 is deposited over the entire surface to a thickness of 1 μm, whereby the trench is filled with the oxide layer 108 (FIG. 2B).

The oxide layer 108 is etched back by means of anisotropic etching or polishing, thereby leaving only a portion 108a of the oxide layer 108 in the trench 109. Subsequently, an ion implantation step (not shown) is performed for controlling the threshold voltages of MOSFETs. A gate oxide layer 104 is thermally grown to a thickness of about 10 nm and the gate electrode layer 105 of polycrystalline silicon is formed to a thickness of 300 nm (FIG. 2C). This figure corresponds to the case where the gate electrode layer 105 extends continuously over one trench portion in FIG. 1C.

In forming such a trench isolation region 103 it is required to allow for process margins for the etchback of the oxide layer 108. Thus, a predetermined amount of overetching is needed. As a result, the surface of the oxide layer 108a after the etching will become slightly lower than the surface of the silicon substrate 101. Thus, the gate oxide layer 104 will have nearly rectangular steps in the areas surrounded by circles A in FIG. 2C.

With such trench device isolation, an electric field is set up by a difference in level between the surface of the oxide layer 108a and the surface of the silicon substrate 101, which results in a decrease in the threshold voltage of the MOSFET. In a MOSFET with a narrow gate in particular, the electric field is enhanced in the step (edge) portions, which results in a significant decrease in the threshold voltage. This is due to a phenomenon by which a parasitic MOSFET having a low threshold voltage is formed in the edge portions where there is a difference in level between the substrate surface and the trench surface. This phenomenon is not desirable for MOS integrated circuits in which a very large number of MOSFETs having different gate widths are packed because the threshold voltage may vary from FET to FET. With the MOSFETs exhibiting this phenomenon there are the possibilities of an increase in standby current and a decrease in reliability of transistors; thus, it is desirable that this phenomenon should be eliminated.

SUMMARY OF THE INVENTION

It is an object of the present invention to provide a trench-isolated semiconductor device which is adapted to ease the concentration of electric fields in edge portions of a trench isolation region to thereby prevent the threshold of MOSFETs from lowering.

It is the other object of the present invention to provide a method of forming such a trench isolation region.

To attain the object, a semiconductor device of the present invention comprises: a semiconductor substrate having a major surface; a trench device isolation region having a trench selectively formed to define at least one island region in the major surface of the semiconductor substrate and a filler insulatively formed within the trench; an elongated gate electrode insulatively formed over a central portion of the island region so that each of its both ends in the direction of its length overlaps the trench device isolation region; and source and drain regions formed within the island region on the both sides of the gate electrode, the surface of the trench device isolation region being lower than the major surface of the semiconductor surface, portions of the major surface of the semiconductor substrate that are located under the gate electrode at the boundary with the trench device isolation region being rounded, and the radius of curvature of the portions of the major surface of the semiconductor substrate being selected to be not less than 50 nm.

A method of the present invention which forms a trench device isolation region in a surface of a semiconductor substrate comprises the steps of: forming a first oxide layer on the surface of the semiconductor substrate; forming at least one cover layer on the first oxide layer; selectively removing the cover layer and the first oxide layer to form an opening in the layers to expose a selected portion of the surface of the semiconductor substrate; etching the semiconductor substrate through the opening to form a trench in the semiconductor substrate; subjecting the first oxide layer to side etching through the opening to expose the edge of the semiconductor substrate at the boundary with the trench; and forming a second oxide layer over the entire surface including the inside of the trench, whereby the edge of the semiconductor substrate exposed by the side etching is rounded.

According to the method, the edge of the semiconductor substrate at the boundary with the trench is exposed by side-etching the first oxide layer. The subsequent thermal growth of the second oxide layer permits that edge of the semiconductor substrate to be oxidized and rounded. When the trench is subsequently filled with the third oxide layer to form the trench device isolation region, the surface of the semiconductor substrate gently changes to the surface of the trench isolation region with a certain curvature. When the radius of the curvature is selected to be 50 nm or more, the concentration of electric field in the boundary between the surface of the semiconductor substrate and the surface of the trench isolation region can be prevented. Therefore, MOSFETs having fine gate electrodes can be fabricated with no reduction in threshold voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A, 1B and 1C are views for use in explanation of the structure of a MOSFET surrounded by a trench isolation region; more specifically, FIG. 1A is a plan view of the MOSFET, and FIGS. 1B and 1C are cross-sectional views taken along the line 1B—1B and the line 1C—1C, respectively, of FIG. 1A;

FIGS. 4A through 4H are cross-sectional views of a trench isolation region according to a first embodiment of the present invention in the order of steps of manufacturing thereof;

FIG. 5 is a cross-sectional view of a trench isolation region according to a second embodiment of the present invention in one step of manufacturing thereof;

FIGS. 6A through 6E are cross-sectional views of a trench isolation region according to a third embodiment of the present invention in the order of steps of manufacturing thereof;

FIG. 7 is a cross-sectional view of a trench isolation region according to a fourth embodiment of the present invention in one step of manufacturing thereof;

FIGS. 8 and 9 are graphs illustrating comparisons in threshold characteristics between a MOS transistor of the present invention and a conventional MOS transistor.

DETAILED DESCRIPTION OF THE PREFERRED EMBODIMENTS

Figure 2A:
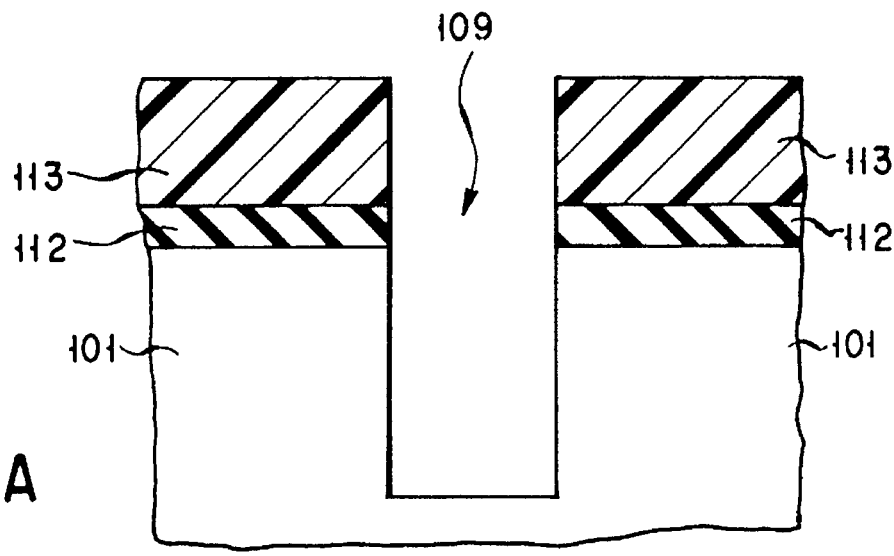
FIGS. 2A, 2B and 2C are cross-sectional views of a trench isolation region in the order of steps of manufacturing thereof.
Figure 2B:
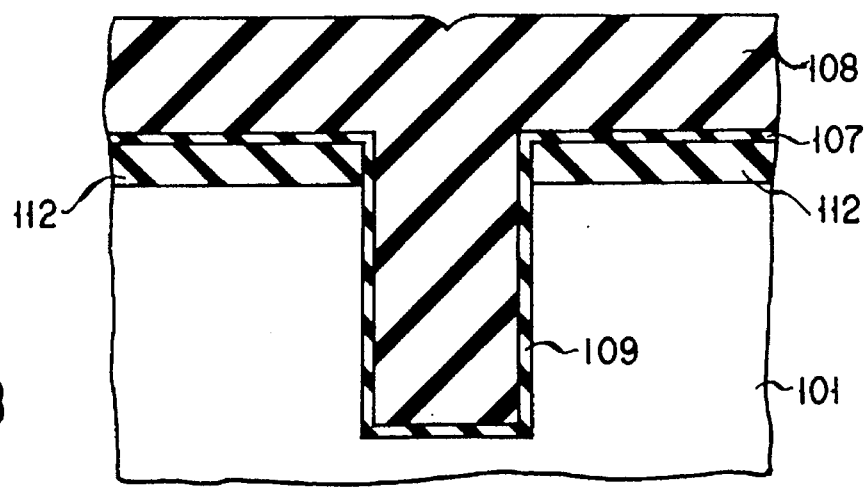
Figure 2C:
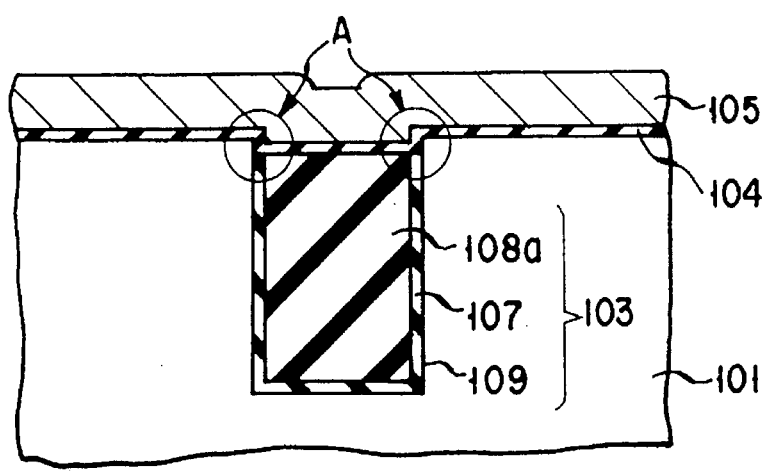
Figure 3A:
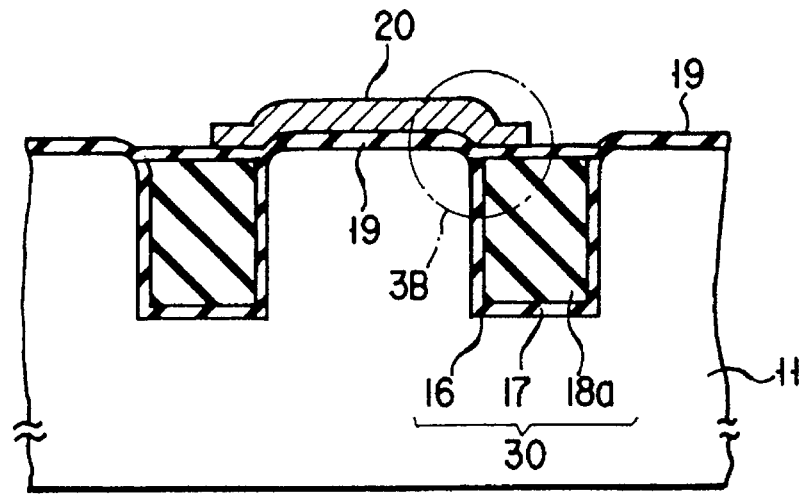
FIG. 3A is a cross-sectional view of a MOSFET according to a first embodiment of the present invention.
Figure 3B:
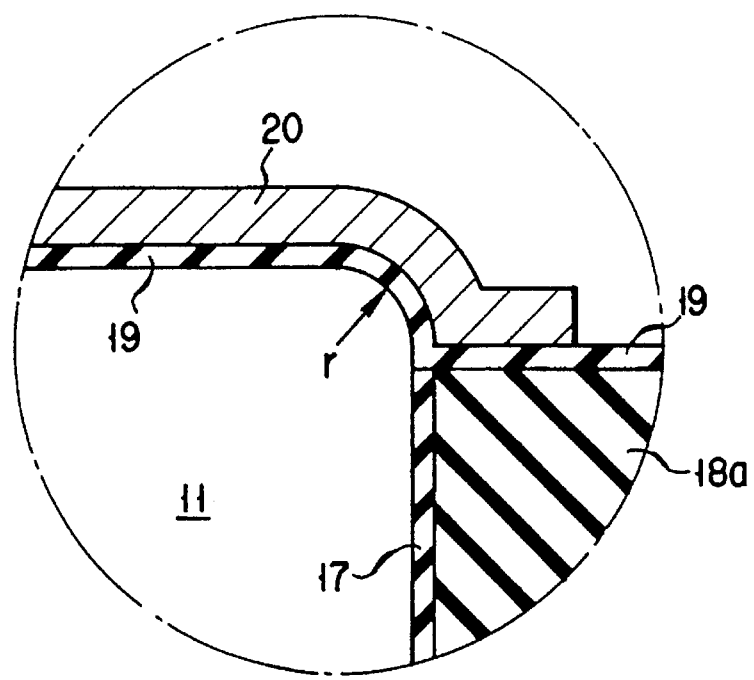
FIG. 3B is an enlarged view of a portion indicated at 3B in FIG. 3A.

FIG. 3A is a cross-sectional view of a MOSFET according to a first embodiment of the present invention, which corresponds to FIG. 1C that is a cross-sectional view of the above conventional transistor taken along the line 1C—1C of FIG. 1A. A trench 16 is formed in a silicon substrate 11. The trench 16 is filled with a silicon oxide layer 18a with an insulating layer 17 formed on the wall of the trench, forming a trench isolation region 30. A gate insulating layer 19 is deposited over the entire surface of the silicon substrate. A gate electrode 20 is selectively formed on the gate insulating layer. The edge profile of the semiconductor substrate 11 (the portion surrounded by a circle 3B) at the boundary with the trench 16 is formed with a gentle curvature so that the electric field will not be concentrated. FIG. 3B is an enlarged view of that portion. The radius of curvature of that edge of the semiconductor substrate 11 is selected to be not less than 50 nm. The reason will be described later.

Figure 4A:
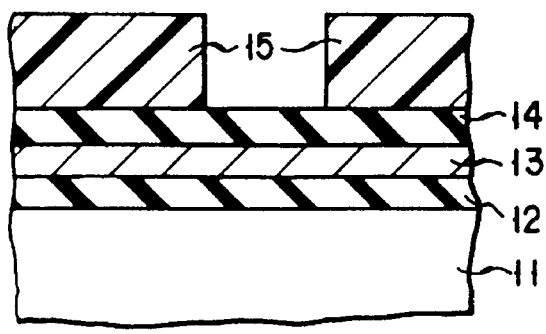

Next, a method of forming the trench will be described with reference to FIGS. 4A to 4H. In these figures, only one trench portion is illustrated. First, a first silicon oxide layer 12 is formed over the silicon substrate 11 to a thickness of the order of 25 nm by means of thermal oxidation, a polycrystalline silicon layer 13 is formed over the first silicon oxide layer to a thickness of the order of 200 nm by chemical vapor deposition, and a second silicon oxide layer 14 is formed over the polycrystalline silicon layer to a thickness of the order of 200 nm by means of chemical vapor deposition. After that, the second oxide layer 14 is coated on top with a photoresist layer, and that photoresist layer is formed into a predetermined resist pattern 15 by means of lithography (FIG. 4A).

Figure 4B:
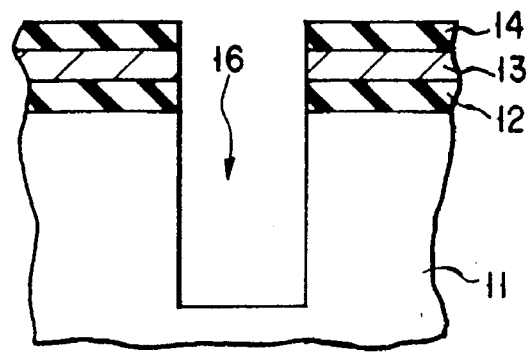

Next, the second oxide layer 14, the polycrystalline silicon layer 13 and the first oxide layer 12 are subjected to anisotropic etching (RIE in this case) in sequence by using the resist pattern 15 as an etching mask. The resist pattern 15 is then removed. After that, a portion of the silicon substrate 11 is etched away to a depth of the order of 700 nm by means of anisotropic etching (RIE in this case) using the second oxide layer 14 as an etching mask, thus forming a trench 16 which is used to form an embedded device isolation region (FIG. 4B).

Figure 4C:
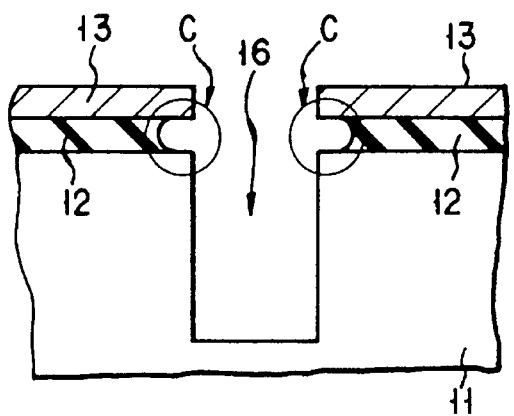

The first oxide layer 12 is then subjected to isotropic etching so that it is recessed laterally to a depth of, say, 50 nm as shown in portions surrounded by circles C in FIG. 4C. For this etching step, it is possible to use either a wet etching technique using ammonium fluoride ($NH_4F$) or hydrofluoric acid (HF) or a chemical dry etching (CDE) technique. Note here that the second oxide layer 14 is etched away at the same time the first oxide layer 12 is etched.

Figure 4D:
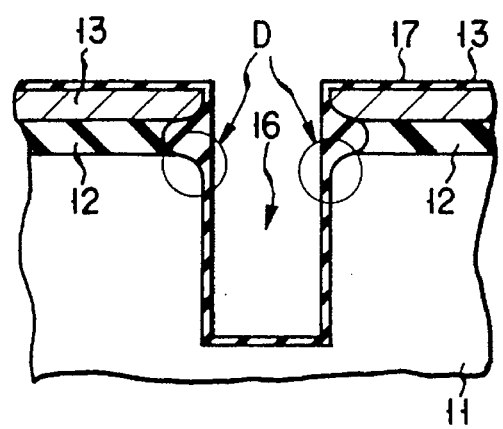

Next, in order to eliminate faults induced in the silicon substrate 11 when the trench 16 is formed, a third oxide layer 17 is thermally grown over the entire surface of the substrate to a thickness of the order of 35 nm. At this time, the edges of the silicon substrate at the boundary with the trench, which are exposed, will be rounded by thermal oxidation as shown in portions surrounded by circles D. The thermal oxidation is performed for one hour at 1,000° C. so that the radius of curvature of the edges will become not less than 50 nm. The recessed portions of the first oxide layer 12 are filled with the oxide layer thanks to the effect of volume expansion of the polycrystalline silicon layer 13 by oxidation (FIG. 4D).

Figure 4E:
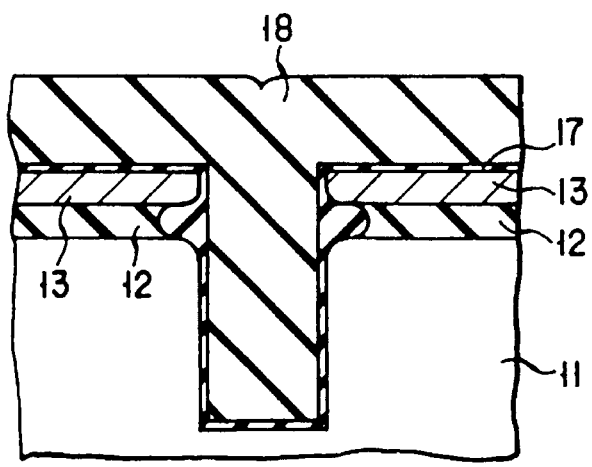
Figure 4F:
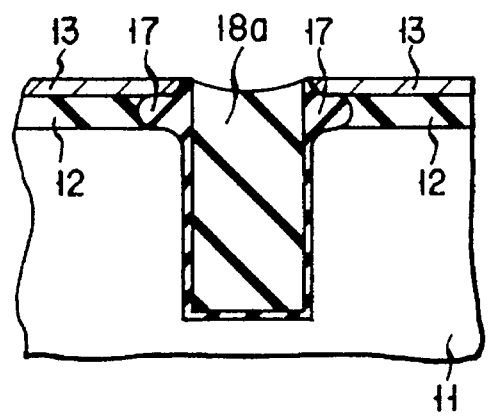

After that, a fourth silicon oxide layer 18 is deposited over the entire surface, including the trench 16, to a thickness of the order of 1 μm by means of chemical vapor deposition (FIG. 4E). The fourth silicon layer 18 is then etched back by means of polishing or anisotropic etching to leave a portion 18a of the oxide layer only in the trench 16. At this time, the polycrystalline silicon layer 13 is used as a stopper layer for etchback by polishing (FIG. 4F).

The polycrystalline silicon layer 13 and the first oxide layer 12 are removed in succession, whereby the trench isolation region 30 is completed. The surface of the silicon substrate 11 borders on the surface of the oxide layer 18a not abruptly but gently (FIG. 4G).

To proceed to the formation of a MOSFET, a device formation region surrounded with the trench isolation region 30 is subjected to ion implantation so that a predetermined threshold will be obtained. After that, as shown in FIG. 4H, a gate oxide layer 19 is deposited over the entire surface to a thickness of the order of 10 nm and then a gate electrode layer 20 of polycrystalline silicon is deposited over the gate oxide layer to a thickness of the order of 300 nm. The gate electrode layer is then patterned. The gate electrode layer 19 is formed to have a gently curved surface in the neighborhood of the edge of the trench isolation region filled with the silicon oxide layer 18a as shown in the circle indicated at D in FIG. 4H. Whereby, the concentration of the electric field in the surface boundary between the silicon substrate 11 and the trench 16 can be eased. The source and drain regions (not shown) are subsequently formed with the result that the MOSFET shown in FIG. 3A is completed.

Next, a trench-isolated MOSFET according to a second embodiment of the present invention will be described. This transistor is identical in section to that shown in FIG. 3A. Thus, only different manufacturing steps will be described.

The steps shown in FIGS. 4A, 4B and 4C are performed first as in the first embodiment. Next, as shown in FIG. 5, the entire surface of the silicon substrate 11 is subjected to isotropic etching with the result that the edge of the silicon substrate is rounded as shown in the circle E of FIG. 5. After that, as shown in FIG. 4D, the third insulating layer 17 is formed as in the previous embodiment. The subsequent steps are the same as those in the previous embodiment.

Thus, according to the present embodiment, after the edge of the silicon substrate 11 at the boundary with the trench has been exposed, isotropic etching is performed to round the substrate edge in advance. After that, the third oxide layer 17 is formed, which permits that edge to be further rounded; thus, the edge can be rounded more greatly than in the first embodiment. That is, the second embodiment ensures that the radius of curvature of the edge becomes 50 nm or more.

A trench isolation region forming method according to a third embodiment of the present invention will be described next. The structure of a MOSFET of the present embodiment is the same as that shown in FIG. 3A; thus, its structure need not be described. The formation of a trench isolation region will be described with reference to FIGS. 6A to 6E with only different steps from the first embodiment taken.

The first oxide layer 12 is deposited over the entire surface of the silicon substrate 11 to a thickness of the order of 25 nm by means of thermal oxidation, the polycrystalline silicon layer 13 is deposited over the first oxide layer to a thickness of the order of 200 nm by means of chemical vapor deposition, and the second oxide layer 14 is deposited over the entire surface of the polycrystalline silicon layer to a thickness of 200 nm by means of chemical vapor deposition. After that, a photoresist layer is coated on the second oxide layer, then patterned by means of lithography to form the resist pattern 15 (FIG. 6A).

Next, the second oxide layer 14, the polycrystalline silicon layer 13 and the first oxide layer 12 are subjected to anisotropic etching (RIE) in sequence using the resist pattern 15 as a mask (FIG. 6B), thereby forming an opening in these layers to expose a portion of the surface of the silicon substrate.

After that, the first oxide layer 12 is subjected to isotropic etching, so that it is laterally recessed to a depth of the order of 50 nm. As the isotropic etching technique, either a wet etching technique using ammonium fluoride ($NH_4F$) or hydrofluoric acid (HF) or a chemical dry etching technique may be used. In performing the isotropic etching, the second oxide layer 14 will be etched like the first oxide layer 12; however, this causes no problem. Thus, both the first and second oxide layers 12 and 14 are etched laterally as shown in circles F in FIG. 6C.

By using the resist pattern 15 as a mask, the silicon substrate 11 is subjected to anisotropic etching to form the trench 16 for isolation in the substrate to a depth of the order of 700 nm (FIG. 6D).

After that, the resist pattern 15 is removed. The third oxide layer 17 is formed over the entire surface including the trench 16 to a thickness of the order of 35 nm by means of thermal oxidation. At this point, the edge of the silicon substrate 11, which is exposed, is oxidized and rounded as shown in circles G in FIG. 6E. In this case, the thermal oxidation is performed for one hour at 1,000° C. so that the radius of curvature r of the edge will become 50 nm or more. Thanks to the effect of volume expansion of the polysilicon layer 13 by oxidation, the recess of the oxide layer 12 is filled with an oxide layer (FIG. 6E). After that, as in the first embodiment, the fourth oxide layer 18 is deposited over the entire surface so as to fill the trench (FIG. 4E), then etched back to form such a trench isolation region 30 as shown in FIG. 4G.

As in the second embodiment, in the present embodiment as well, the edge of the silicon substrate, in which MOSFET source and drain regions are formed, at the boundary with the trench is exposed by laterally etching the first oxide layer 12. By performing thermal oxidation in this state, the edge of the silicon substrate can be rounded.

Next, reference will be made to FIG. 7 to describe a trench isolation region forming method according to a fourth embodiment of the present invention. Only different steps from those in the method of the third embodiment will be described. First, the steps in the third embodiment shown in FIGS. 6A to 6D are performed. Next, as shown in FIG. 7, the silicon substrate 11 is subjected to isotropic etching to round the edge of the trench region as shown in circles H in FIG. 7. After that, as shown in FIG. 6E, the third oxide layer 17 is formed as in the third embodiment, and then the same steps are performed. Thus, according to the present embodiment, the edge of the trench region is rounded two times, ensuring more rounding of the edge.

In the above embodiments, the polycrystalline silicon layer 13 is used as a stopper when a material serving as a filler into the trench is etched back, and the second oxide layer ($SiO_2$) is used as the mask for forming the trench. These examples are described by way of illustration and are not restrictive. Any material whose etching rate is sufficiently different from that of the filler in the trench can be used as the stopper layer. For example, the stopper layer may be made of WSi, MoSi, TiSi, or the like. If the etching mask is made of a different material from the stopper layer, TiN, carbon, or SiN may be used. As the filler material, on the other hand, SiN, Si, PSG, BPSG, or the like may be used. Moreover it is not essential to make a two-layer structure comprised of a stopper layer and an etching mask. A single cover layer may be used as an etching mask.

The threshold voltage characteristic of NMOSFETs having the trench device isolation regions formed in accordance with the above-described methods will be described below with reference to FIG. 8, which shows threshold voltage (volt) versus gate width (μm). With a conventional MOSFET, the threshold voltage when the gate width is 0.4 μm is 0.08 V (15%) less than that when the gate width is 1.2 μm. with the MOSFET of the present invention, however, even when the gate width is 0.4 μm, the threshold voltage remains unchanged from when the gate width is 1.2 μm.

Figure 9:
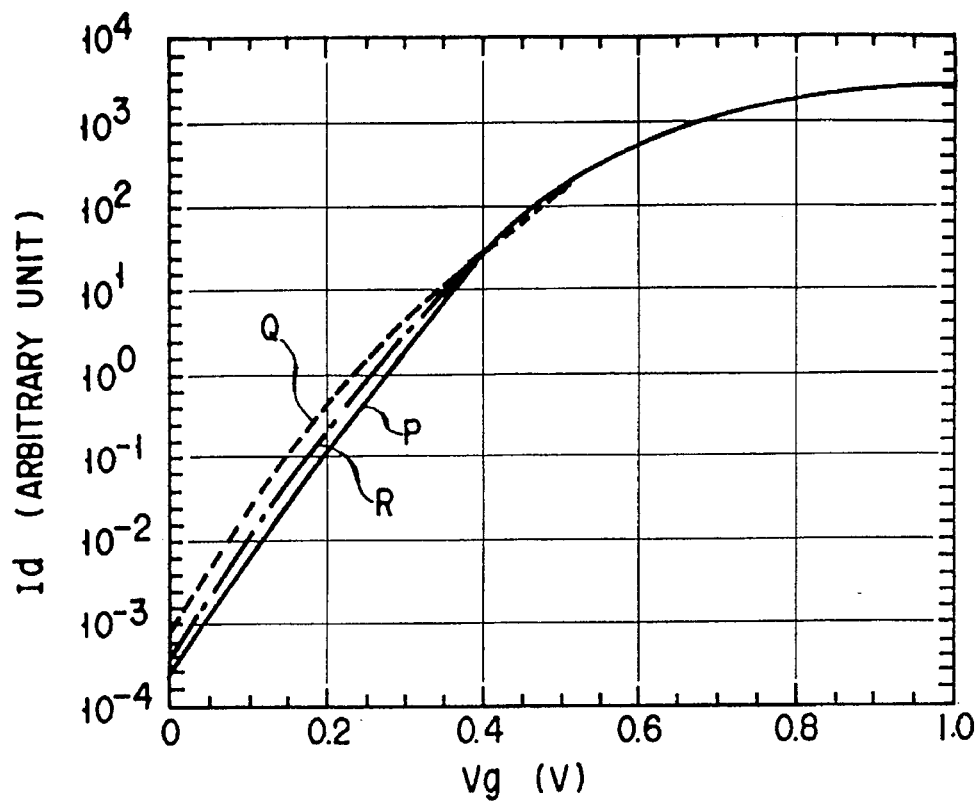
Figure 10:
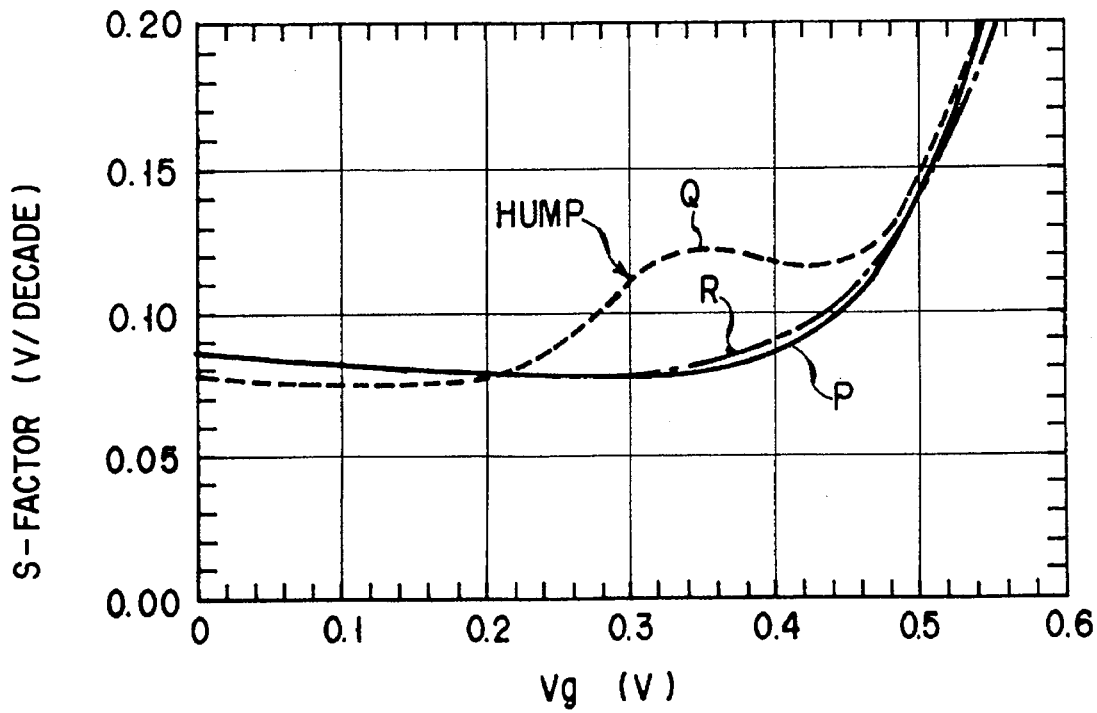
FIG. 10 is a graph for use in explanation of the "hump" phenomenon for a MOS transistor of the present invention and a conventional MOS transistor.

A decrease in the threshold voltage of a MOSFET due to a difference in level between the surface of the silicon substrate and the surface of the trench isolation region can also be understood by the so-called "hump" phenomenon seen in the gate voltage (Vg) versus drain current (Id) characteristic of MOSFETs. FIG. 9 shows an Id versus Vg curve in which the drain current Id is represented in logarithm by relative values. With the drain current represented in logarithm, in the subthreshold region wherein Vg is less than 0.5 V there is a region where the slope is straight. The relationship between this slope, represented by S-Factor (Subthreshold Swing)=voltage/decade, and Vg is shown in FIG. 10. In this figure, the continuous curve P represents the characteristic of a normal MOSFET. From this it will be understood that the S-Factor characteristic is nearly flat in the subthreshold region. The dotted curve Q shows the "hump" phenomenon. The dashed-and-dotted curve R shows the intermediate characteristic. Referring back to FIG. 9, it will be understood that the dotted curve Q showing the hump phenomenon is shifted to the left of the continuous curve P in the region where the gate voltage Vg is low, resulting in a substantial decrease in the threshold voltage. The continuous curve P was measured for a MOSFET in which the radius of curvature r of the edge of the substrate at the boundary with the trench is substantially 50 nm. The dotted curve Q and the dashed-and-dotted curve R correspond to MOSFETs in which the radii are 0 and 30 nm, respectively. From this it can be said that no hump phenomenon will occur and hence the threshold will not be lowered if the radius of curvature of the trench edge is set at 50 nm or more. The above measurements were made on samples manufactured using the conventional method and the method of the present invention. By this the effectiveness of the present invention can be confirmed. Note that the above samples were 1 μm in gate width and 5 μm in gate length.

According to the present invention, as described above, the edge profile of the silicon substrate at the boundary with the trench isolation region can be curved gently. This prevents the electric field from being concentrated in the substrate edge portion under the gate electrode. Even if the gate width is narrow, therefore, the threshold voltage will not be lowered.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of forming a trench device isolation region in a surface of a semiconductor substrate, the method comprising the steps of:

forming a first oxide layer on the surface of said semiconductor substrate;

forming a polycrystalline silicon layer on said first oxide layer;

removing portions of said polycrystalline silicon layer and said first oxide layer to form an opening in said layers to expose a selected portion of the surface of said semiconductor substrate;

etching said semiconductor substrate through said opening to form a trench in said semiconductor substrate;

subjecting said first oxide layer to side etching through said opening to expose an edge of said semiconductor substrate at a boundary with said trench; and forming a second oxide layer over substantially all exposed surfaces including an inside of said trench, such that said edge of said semiconductor substrate exposed by said side etching is rounded.

2. The method according to claim 1, further comprising, after the step of subjecting said first oxide layer to side etching, the step of performing isotropic etching to thereby round said edge of said semiconductor substrate.

3. The method according to claim 1, in which said second oxide layer is formed by means of thermal oxidation, and said edge of said semiconductor substrate is rounded by said thermal oxidation.

4. A method of forming a trench device isolation region in a surface of a semiconductor substrate, the method comprising the steps of:

forming a first oxide layer on the surface of said semiconductor substrate;

forming a polycrystalline silicon layer on said first oxide layer;

removing portions of said polycrystalline silicon layer and said first oxide layer to form an opening in said layers to expose a selected portion of the surface of said semiconductor substrate;

subjecting said first oxide layer to side etching through said opening;

etching said semiconductor substrate through said opening to form a trench in said semiconductor substrate after said step of subjecting said first oxide layer to side etching, such that an edge of said semiconductor substrate at a boundary with said trench is exposed as a result of said prior side etching of said first oxide layer; and forming a second oxide layer over substantially all exposed surfaces including an inside of said trench, such that said edge of said semiconductor substrate is rounded.

5. The method according to claim 4, further comprising, after the step of etching said semiconductor substrate, the step of performing isotropic etching to thereby round said edge of said semiconductor substrate.

6. The method according to claim 4, in which said second oxide layer is formed by means of thermal oxidation, and said edge of said semiconductor substrate is rounded by said thermal oxidation.

7. The method according to claim 3, wherein said step of subjecting said first oxide layer to side etching creates a recess in said first oxide layer, a volume expansion of said polycrystalline silicon layer by said thermal oxidation fills said recess with said second oxide layer, and said edge of said semiconductor substrate is further rounded by said volume expansion of said polycrystalline silicon layer filling said recess with said second oxide layer.

8. The method according to claim 7, wherein a radius of curvature of said edge of said semiconductor substrate is at least about 50 nm.

9. The method according to claim 3, wherein said thermal oxidation is performed for at least about an hour at about 1000° C.

10. The method according to claim 6, wherein said step of subjecting said first oxide layer to side etching creates a recess in said first oxide layer, a volume expansion of said polycrystalline silicon layer by said thermal oxidation fills said recess with said second oxide layer, and said edge of said semiconductor substrate is further rounded by said volume expansion of said polycrystalline silicon layer filling said recess with said second oxide layer.

11. The method according to claim 10, wherein a radius of curvature of said edge of said semiconductor substrate is at least about 50 nm.

12. The method according to claim 6, wherein said thermal oxidation is performed for at least about an hour at about 1000° C.

* * * * *